United States Patent
Yamano

(10) Patent No.: US 8,997,333 B2
(45) Date of Patent: Apr. 7, 2015

(54) METHOD OF MANUFACTURING INDUCTOR

(75) Inventor: Kazuhiko Yamano, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 78 days.

(21) Appl. No.: 13/476,092

(22) Filed: May 21, 2012

(65) Prior Publication Data

US 2012/0227250 A1 Sep. 13, 2012

Related U.S. Application Data

(60) Division of application No. 12/170,699, filed on Jul. 10, 2008, now Pat. No. 8,201,318, which is a continuation of application No. PCT/JP2006/320387, filed on Oct. 12, 2006.

(30) Foreign Application Priority Data

Jan. 16, 2006 (JP) .................................. 2006-007021

(51) Int. Cl.
 *H01F 41/04* (2006.01)
 *H01F 41/12* (2006.01)
 *H01F 27/30* (2006.01)
 (Continued)

(52) U.S. Cl.
 CPC ............ *H01F 41/041* (2013.01); *H01F 27/306* (2013.01); *H01F 41/122* (2013.01); *H03H 2001/0078* (2013.01);
 (Continued)

(58) Field of Classification Search
 CPC . H01F 41/041; H01F 41/122; H01F 17/0013; H01F 27/292; H01F 27/306; H01F 2017/0073; H03H 2001/0078; H03H 2001/0085

USPC .......... 29/602.1, 603.23, 606, 607, 609, 842, 29/846; 336/200, 205, 232
 See application file for complete search history.

(56) References Cited

U.S. PATENT DOCUMENTS 6,504,466 B1 * 1/2003 Katsurada ..................... 336/200
6,713,162 B2 * 3/2004 Takaya et al. ............. 336/200 X
(Continued)

FOREIGN PATENT DOCUMENTS

| JP | 05135949 A | * | 6/1993 | .................... 29/602.1 |
| JP | 11214235 A | * | 8/1999 | |
| JP | 2005109097 A | * | 4/2005 | |

OTHER PUBLICATIONS

Machine Language Translation (English) of Japanese Patent Publication JP 2005-109097, Feb. 2014.*
Machine Language Translation (English) of Japanese Patent Publication JP 11-214235, Feb. 2014.*

*Primary Examiner* — A. Dexter Tugbang
(74) *Attorney, Agent, or Firm* — Keating & Bennett, LLP

(57) ABSTRACT

A method of manufacturing an inductor includes a lamination step, a division step, a firing step, and a plating step. In the lamination step, a laminate including an insulator, a coil body, and external electrodes is formed. That is, in the lamination step, insulating layers having wide filling conductors, insulating layers having narrow filling conductors, and conductor patterns having external electrode patterns are laminated. As a result, the conductor patterns form the coil body, and the wide filling conductors, the narrow filling conductors, and the external electrode patterns form the external electrodes. The narrow filling conductors have a width that is less than the widths of the wide filling conductors and the external electrode patterns, and recesses and projections are provided in the external electrodes.

6 Claims, 15 Drawing Sheets

(51) Int. Cl.
   *H01F 17/00*  (2006.01)
   *H01F 27/29*  (2006.01)
   *H03H 1/00*   (2006.01)
(52) U.S. Cl.
   CPC ... *H03H 2001/0085* (2013.01); *H01F 17/0013* (2013.01); *H01F 27/292* (2013.01); *H01F 2017/0073* (2013.01)

(56) References Cited

U.S. PATENT DOCUMENTS 6,888,439 B2 *  5/2005  Razzell et al. .......... 29/602.1 X
8,201,318 B2 *  6/2012  Yamano .................... 29/602.1

\* cited by examiner

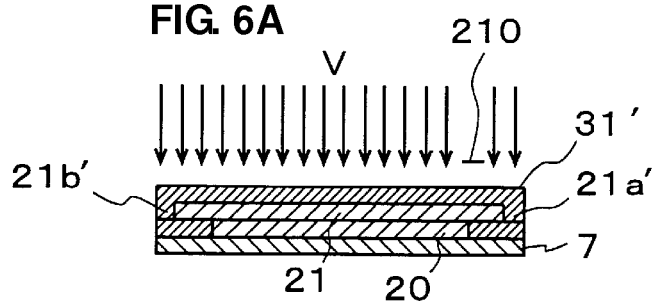
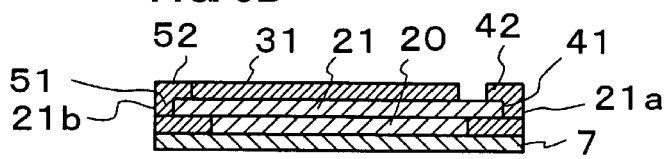
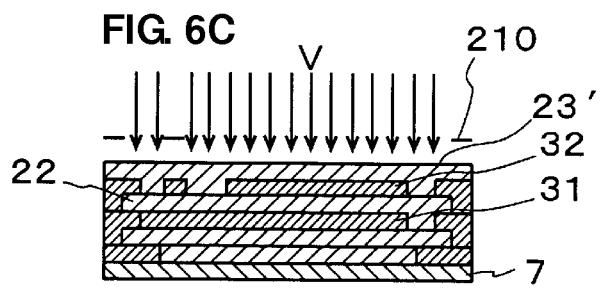
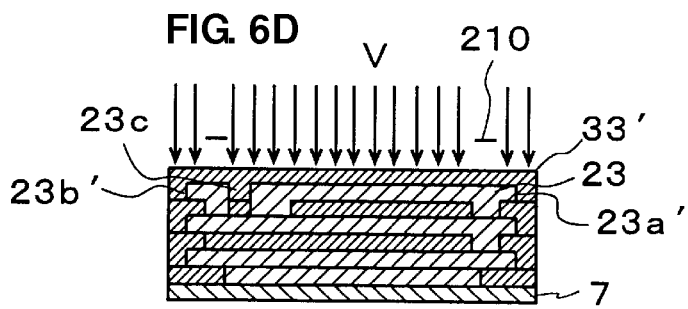
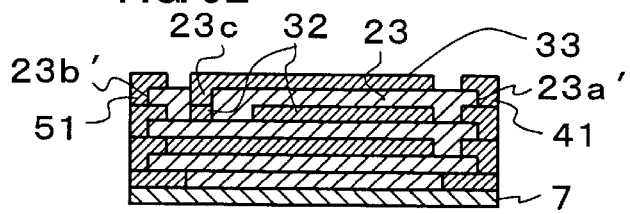
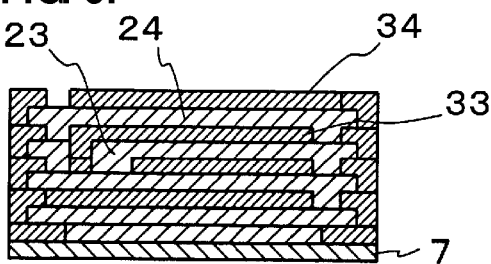

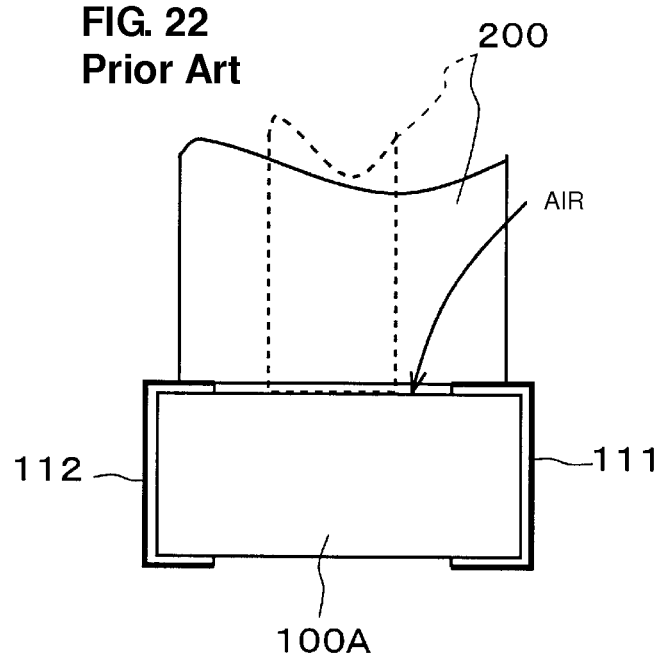

METHOD OF MANUFACTURING INDUCTOR

BACKGROUND OF THE INVENTION

1. Field of the Invention

The present invention relates to a method of manufacturing an inductor preferably for use in a mobile phone, for example.

2. Description of the Related Art

Japanese Unexamined Patent Application Publication No. 11-204336 and Japanese Unexamined Patent Application Publication No. 2005-109097 disclose methods of manufacturing an inductor.

According to a manufacturing method of the related art, PET films and dummy substrates are used as base materials, and a photosensitive insulating paste is printed on the base material. Then, the photosensitive insulating paste is exposed (developed and additionally exposed as necessary) and dried to form an insulating layer. The photosensitive conductive paste is printed, exposed, developed (additionally exposed as necessary), and dried to form a conductor pattern. Next, the photosensitive insulating paste is printed, exposed, developed (additionally exposed as necessary), and dried to form an insulating layer and a viahole. A conductor pattern and an insulating layer with a viahole are alternately laminated, thereby forming a laminate. Next, this laminate is divided to form small chips having a desired chip size. Then, the base substrate is removed from the chips, and the chips are fired. After external electrodes are formed on end portions of each chip, plating is performed on external electrode portions to complete the formation of a chip-shaped inductor.

However, the above-described manufacturing method of the related art has the following problems.

FIG. 21 is an exterior view of an inductor of the related art. FIG. 22 is a schematic sectional view showing an inductor being transported.

As shown in FIG. 21, in a manufacturing method of the related art, after a chip 100A of an inductor 100 is formed, since external electrodes 111 and 112 are formed on both ends of the chip 100A, it is not possible to sufficiently maintain the volume of the chip 100A as desired. For example, when an inductor of a specified size 0603 (a vertical size of about 0.6 mm, a horizontal size of about 0.3 mm, and a height of about 0.3 mm) is to be manufactured, the size of the fired chip 100A is set to a vertical size of about 0.56 mm, a horizontal size of about 0.26 mm, and a height of about 0.26 mm, and the external electrodes 111 and 112 are formed on both end portions of the chip 100A, thereby obtaining a specified size 0603. For this reason, the size of the chip 100A is reduced, a limitation is imposed on the size of a coil to be formed inside thereof, and an inductance value of a sufficient magnitude cannot be obtained.

Furthermore, as shown in FIG. 22, since a step difference corresponding to the thickness of the external electrodes exists between the surface of the chip 100A and the external electrodes 111 and 112, a problem arises when a very small inductor 100 is to be mounted. That is, as indicated by the dashed line in FIG. 22, when the size of the inductor 100 is considerably larger than the diameter of the suction nozzle 200, even if a step difference exists between the surface of the chip 100A and the external electrodes 111 and 112, air leakage does not occur. Therefore, it is possible for the suction nozzle 200 to strongly suck the inductor 100 and to transport it to a desired mounting location. However, as the size of the inductor decreases, when a very small inductor 100 of a specified size 0603 is to be transported, as indicated by a solid line, the suction nozzle 200 spans the external electrodes 111 and 112, a gap occurs between the suction nozzle 200 and the surface of the chip 100A, and air leakage occurs. For this reason, the suction nozzle 200 cannot strongly suck the inductor 100, there is a risk that the inductor 100 may be dropped while being transported, and the inductor 100 may be mounted at a location that is deviated from a desired mounting location.

SUMMARY OF THE INVENTION

To overcome the problems described above, preferred embodiments of the present invention provide a method of manufacturing an inductor capable of effectively utilizing chip volume and capable of preventing problems during mounting by forming external electrode portions in advance when a laminate that has not been divided is formed.

A method of manufacturing an inductor according to a preferred embodiment of the present invention includes a lamination step of forming a laminate having a plurality of chips each of which includes a coil body enclosed in an insulating layer and a pair of external electrodes that are connected to either end of the coil body, the external electrodes being exposed from an insulating layer; a division step of dividing the laminate formed in the lamination step into chips; and a firing step of firing each chip formed in the division step, wherein the lamination step includes a first process of forming, using a conductive paste, a conductor pattern for the coil body on the insulating layer and an external electrode pattern for the external electrodes on a side portion of the insulating layer by one of a printing process and by a photolithography process, and a second process of forming, using an insulating paste, an insulating layer having a viahole through which the conductor pattern can be inspected and a cutout portion that is continuous with the external electrode pattern on the conductor pattern and the external electrode pattern by one of a printing process and by a photolithography process, and repeating the first and second processes to form the plurality of chips each including the coil body formed of the conductor pattern and the viahole, and a pair of external electrodes formed of the external electrode pattern and a conductor filled in the cutout portion.

In the lamination step, a laminate having a plurality of chips each including a coil body enclosed in an insulating layer and a pair of external electrodes is formed. More specifically, in the first process, a conductive paste is used, and a conductor pattern of a coil body is formed on the insulating layer by a printing process or a photolithography process. Also, an external electrode pattern for an external electrode is formed on side portions of the insulating layer. Furthermore, in the second process, by using an insulating paste, an insulating layer having a viahole through which a conductor pattern can be inspected and a cutout portion that is continuous with the external electrode pattern is formed on the conductor pattern and the external electrode pattern by a printing process or a photolithography process. Then, by repeatedly performing the first and second processes, a plurality of chips are formed each including a coil body formed of a conductor pattern and a viahole, and a pair of external electrodes formed of an external electrode pattern and a conductor filled in the cutout part. Next, in the division step, the laminate is divided into chips, and in the firing step, each chip is fired.

Preferably, in the first process of the lamination step, a photosensitive conductive paste is applied to the insulating layer and is exposed and developed by a photolithography process, thereby forming the conductor pattern and the external electrode pattern, and in the second process of the lamination step, a photosensitive insulating paste is applied to the conductor pattern and the external electrode pattern and is exposed and developed by a photolithography process, thereby forming an insulating layer having the viahole and the cutout portion.

In the first process of the lamination step, the photosensitive conductive paste is applied to the insulating layer and is exposed and developed by a photolithography process, thereby forming a conductor pattern and an external electrode pattern. Then, in the second process of the lamination step, the photosensitive insulating paste is applied to the conductor pattern and the external electrode pattern and is exposed and developed by a photolithography process, thereby forming an insulating layer having a viahole and a cutout portion.

Preferably, in the lamination step, the directions of both magnetic poles of the coil body are substantially the same as the lamination direction.

Since the directions of both magnetic poles of the coil body extend in substantially the same direction as the lamination direction, by using the chip, which is made to be arranged sideways, the surroundings of both the magnetic poles are an air environment.

Preferably, in the first process of the lamination step, long external electrode patterns, which have substantially the same length as the side portions of the insulating layer, are formed on two opposed side portions of the insulating layer. In the second process of the lamination step, long cutout portions, which have substantially the same length as the external electrode pattern, are formed on both opposed side portions.

Preferably, in the second process of the lamination step, the cutout portion has a width that is less than the width of the external electrode pattern.

Preferably, in the first process of the lamination step, a long cutout portion that is less than half the length of the side portions are formed on two corner portions of one side portion of the insulating layer, and in the second process of the lamination step, a long external electrode pattern having approximately the same length as the external electrode pattern is formed in the two corner portions of the one side portion.

Preferably, in the second process of the lamination step, the cutout portion has a width that is less than the width of the external electrode pattern.

Preferably, in the first process of the lamination step, L-shaped external electrode patterns are formed on two corner portions of one side portion of the insulating layer. In the second process of the lamination step, the cutout portion has substantially the same shape as the external electrode pattern formed in the two corner portions of the one side portion.

Preferably, in the second process of the lamination step, the cutout portion has a width that is less than the external electrode pattern.

The conductive paste and the insulating paste preferably have substantially equal thermal expansion coefficients.

A plating step for plating the external electrode surface of each chip fired in the firing step is preferably provided.

As has been described above in detail, in the method of manufacturing an inductor according to preferred embodiments of the present invention, in the lamination step, since a laminate having a plurality of chips each including a pair of external electrodes is formed, a step of forming external electrodes is not necessary in subsequent steps. That is, as in the above-described related art, since it is not necessary to form external electrodes at both ends of a chip by a dipping method, the number of steps is reduced. Furthermore, the fact that external electrodes are also formed at the same time that a chip is formed enables the size of the chip to be a size that is substantially equal to a specified size. That is, effective use of the chip volume can be achieved without reducing the volume corresponding to the thickness of the external electrodes.

Furthermore, since the external electrodes are formed integrally with the chip, a large step difference does not exist between the external electrodes and the chip surface. Even if a step difference occurs, it is a very small step difference corresponding to the thickness of the plating applied to the surface of the external electrodes, which is negligible. For this reason, even when a very small inductor having a specified size 0603 is to be transported, a large gap does not occur between the suction nozzle and the surface of the chip. As a result, the problem of air leakage is prevented in the transportation using a suction nozzle.

In particular, since a conductor pattern and an external electrode pattern are formed using a photolithography process, it is possible to form a coil body and external electrodes with high accuracy.

Since the surroundings of both magnetic poles are an air environment and satisfactory magnetic coupling can be obtained, inductors having good characteristics are produced.

Since the insulating layer and the external electrodes are engaged with each other via the recess/projection relationship, the engagement of the external electrodes with the insulating layer is satisfactory, and an external electrode portion is prevented from being removed by a shearing force applied during the division step.

Since external electrodes having an L-shape when viewed in the lamination direction are formed at both corner portions, it is possible to use one of the sides of the L-shaped external electrodes to connect a land and to use the other side of the L-shaped external electrode to adhere a fillet. Then, by adjusting the length of the other side, it is possible to control the amount of fillet to be adhered.

Since a recess/projection relationship with the insulating layer is provided in the width direction of the L-shaped external electrode, the engagement of the external electrode with the insulating layer is improved.

Since the conductive paste and the insulating paste expand with substantially the same expansion coefficient, stress inside the chip, which occurs after firing, is reduced, and as a result, the chip shape is stabilized and is not deformed. For this reason, inductors having high dimensional accuracy are produced.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 6A to 6F include sectional views showing steps in which the first process and the second process of the lamination step are performed, and a conductor pattern and an external electrode pattern are laminated on an insulating layer of a lower layer.

FIG. 22 is a schematic sectional view showing a state in which an inductor is transported.

DETAILED DESCRIPTION OF PREFERRED EMBODIMENTS

Preferred embodiments of the present invention will be described below with reference to the drawings.

First Preferred Embodiment

Figure 1:
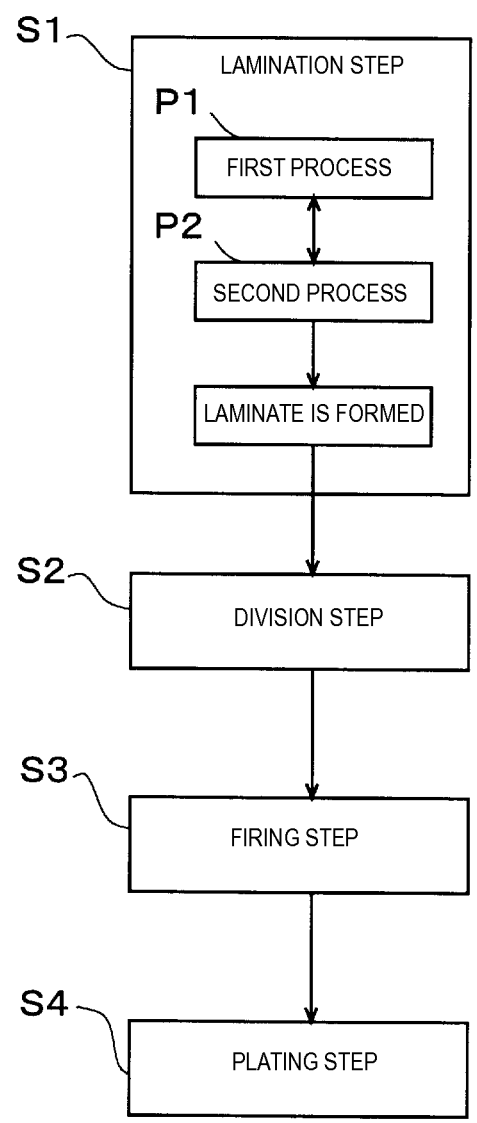
FIG. 1 is a block diagram showing a method of manufacturing an inductor according to a first preferred embodiment of the present invention.

FIG. 1 is a block diagram showing a method of manufacturing an inductor according to a first preferred embodiment of the present invention.

As shown in FIG. 1, a method of manufacturing an inductor according to this preferred embodiment includes a lamination step S1, a division step S2, a firing step S3, and a plating step S4. Then, the lamination step S1 includes a first process P1 and a second process P2, and by repeatedly performing the first and second processes P1 and P2, a laminate of inductors is formed.

Here, in order to facilitate understanding of the method of manufacturing an inductor according to this preferred embodiment, the configuration of an inductor manufactured in this preferred embodiment will be described in advance.

Figure 2:
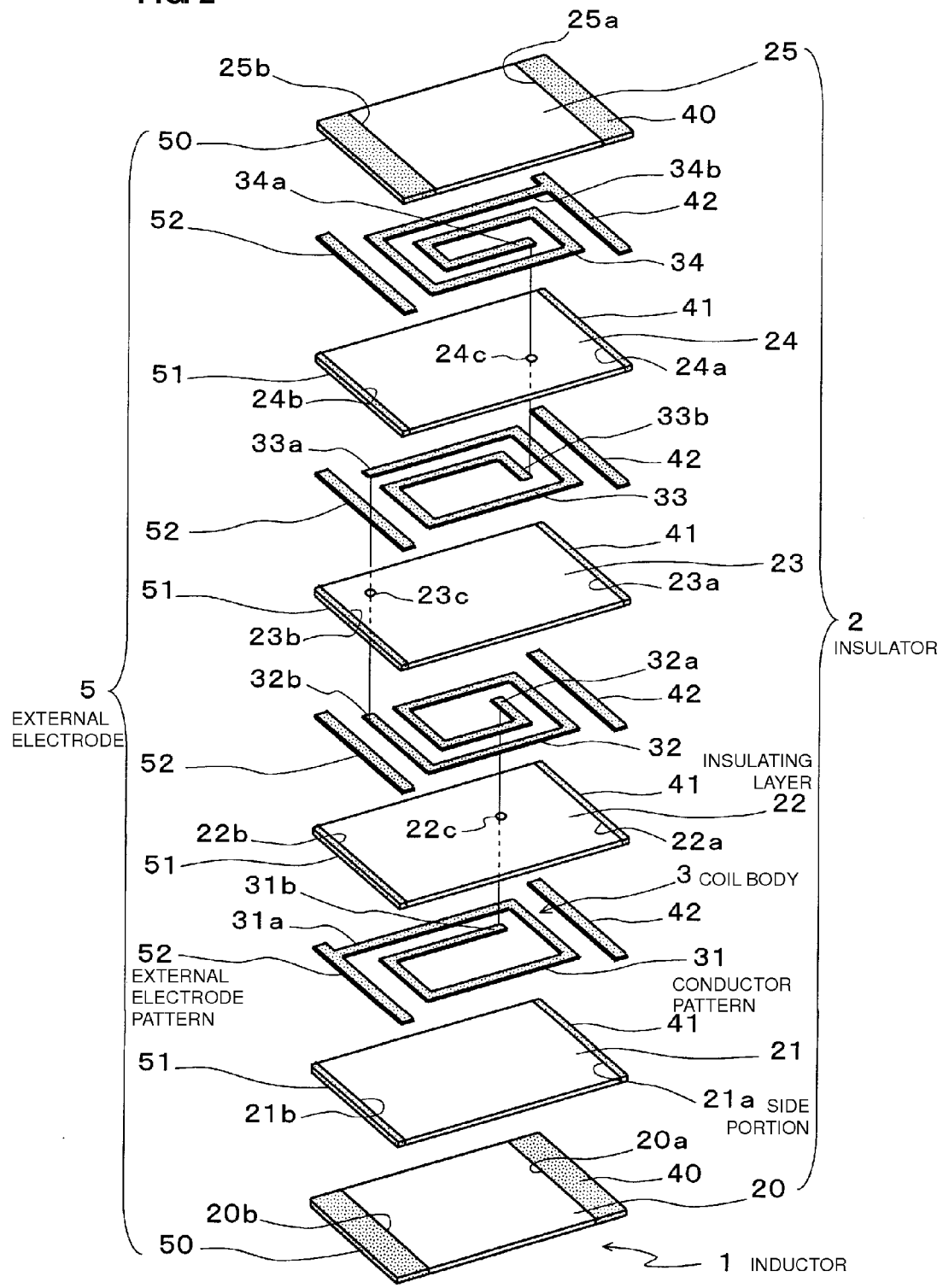
FIG. 2 is an exploded perspective view of an inductor.
Figure 3:
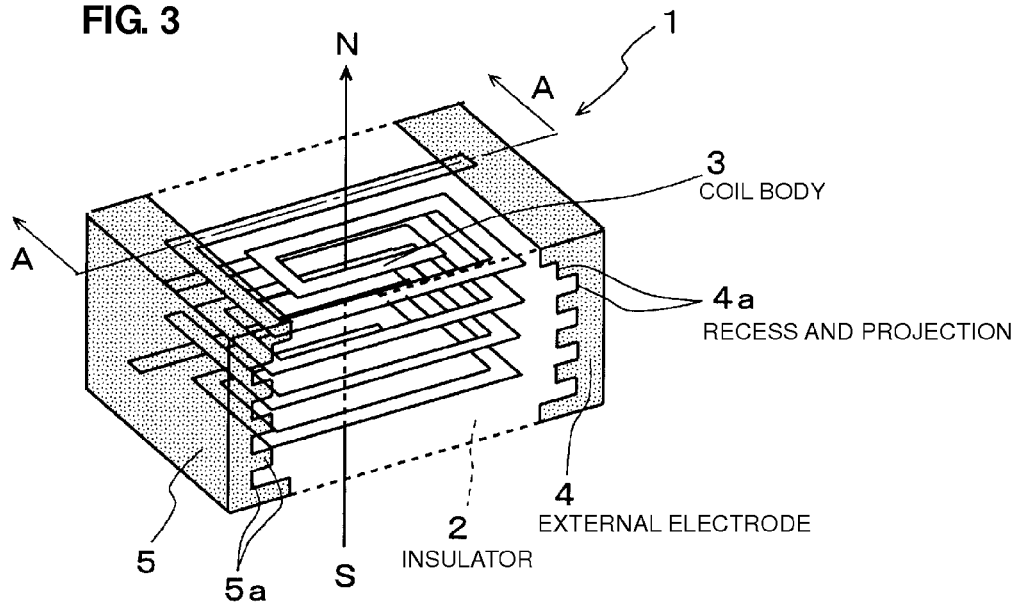
FIG. 3 is a perspective view of an inductor in a state in which a coil body is shown transparently.
Figure 4:
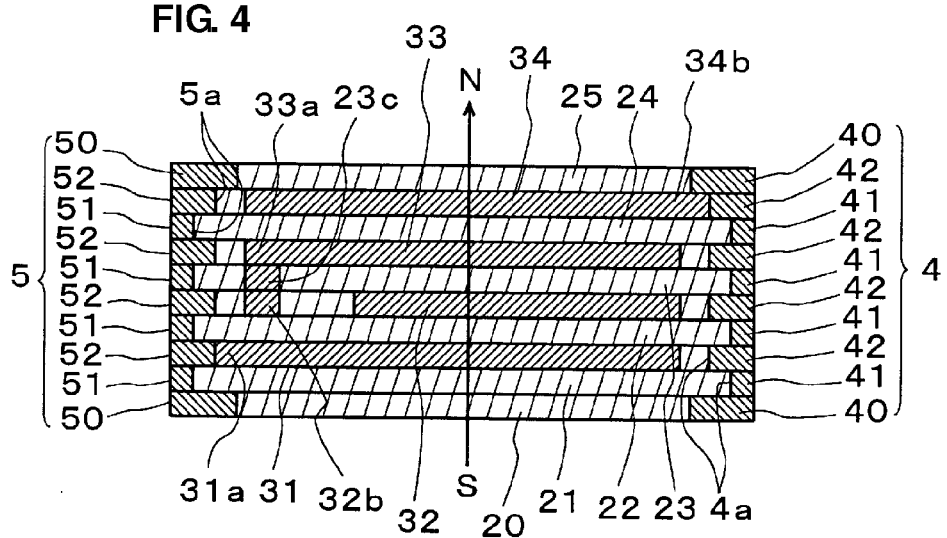
FIG. 4 is a sectional view taken along the line A-A in FIG. 3.

FIG. 2 is an exploded perspective view of an inductor. FIG. 3 is a perspective view of an inductor in a state in which a coil body is shown transparently. FIG. 4 is a sectional view taken along the line A-A in FIG. 3.

As shown in FIG. 3, an inductor 1 is formed in a chip shape. This chip includes an insulator 2, a coil body 3 enclosed in the insulator 2, and a pair of external electrodes 4 and 5.

As shown in FIG. 2, the insulator 2 is defined by a plurality of insulating layers 20 to 25 made of an insulating material, such as glass, for example. The coil body 3 is defined by a plurality of conductor patterns 31 to 34 made of a conductive material, such as silver, for example. The external electrode 4 (5) is defined by a wide filling conductor 40 (50), a narrow filling conductor 41 (51), and an external electrode pattern 42 (52), such as silver, for example.

More specifically, the insulating layer 20 is disposed at the lowest layer. The side portions 20a and 20b are cut out by a photolithography process (to be described later). The wide filling conductors 40 and 50 having substantially the same length as the side portions 20a and 20b are adhered to the insulating layer 20 inside the cutout portion.

The insulating layer 21 is laminated on the insulating layer 20, and both side portions 21a and 21b thereof are cut out. Then, inside the cutout portion, the narrow filling conductors 41 and 51 having substantially the same length as the side portions 21a and 21b are adhered to the insulating layer 21, and are electrically connected to the wide filling conductors 40 and 50 of the lower layers, respectively.

The conductor pattern 31 has a spiral shape including about two turns and is formed on the insulating layer 21 by a photolithography process (to be described later). On both sides of the conductor pattern 31, that is, on the side portions 21a and 21b of the insulating layer 21, external electrode patterns 42 and 52 are formed, respectively. The external electrode patterns 42 and 52 are long patterns having substantially the same length as the side portions 21a and 21b and are electrically connected to the narrow filling conductors 41 and 51 of the lower layer, respectively. Furthermore, the external electrode pattern 52 is continuous with an outer end portion 31a of the conductor pattern 31. On such a conductor pattern 31, an insulating layer 22 is laminated.

The insulating layer 22 also has substantially the same shape and substantially the same structure as the insulating layer 21, and includes narrow filling conductors 41 and 51 having substantially the same length as the side portions 22a and 22b. The narrow filling conductors 41 and 51 are electrically connected to the external electrode patterns 42 and 52 of the lower layers, respectively.

The conductor pattern 32, similar to the conductor pattern 31, is formed on the insulating layer 22 and has a spiral shape including about two turns. An inner end portion 32a thereof is coupled to an inner end portion 31b of the conductor pattern 31 via a viahole 22c in the insulating layer 22. Also, on both sides of the conductor pattern 32, long external electrode patterns 42 and 52 are formed and are electrically connected to the narrow filling conductors 41 and 51 of the insulating layer 22, respectively.

The insulating layer 23 is laminated on the conductor pattern 32 and the external electrode patterns 42 and 52. The insulating layer 23 also has substantially the same shape and substantially the same structure as the insulating layers 21 and 22, includes narrow filling conductors 41 and 51 in both side portions 23a and 23b, and are electrically connected to the external electrode patterns 42 and 52 of the lower layers, respectively.

The conductor pattern 33 is formed on the insulating layer 23 and has a spiral shape including about two turns, with an outer end portion 33a thereof being coupled to an outer end portion 32b of the conductor pattern 32 via a viahole 23c in the insulating layer 23. Then, long external electrode patterns 42 and 52 are formed on both sides of the conductor pattern 33, and are electrically connected to the narrow filling conductors 41 and 51 of the insulating layer 23, respectively.

The insulating layer 24 also has substantially the same shape and substantially the same structure as the insulating layers 21 to 23, has narrow filling conductors 41 and 51 in both side portions 24a and 24b, and are electrically connected to the external electrode patterns 42 and 52 of the lower layers, respectively.

Then, the conductor pattern 34 of the topmost layer is formed on the insulating layer 24. The conductor pattern 34 also has a spiral shape including about two turns. An inner end portion 34a thereof is coupled to an inner end portion 33b inside the conductor pattern 33 via a viahole 24c in the insulating layer 24. Then, long external electrode patterns 42 and 52 are formed on both sides of the conductor pattern 34, and are electrically connected to the narrow filling conductors 41 and 51 of the insulating layer 23, respectively. Furthermore, the external electrode pattern 42 is continuous with an outer end portion 34b of the conductor pattern 34.

Then, the topmost insulating layer 25 is laminated on the conductor pattern 34 and the external electrode patterns 42 and 52. The insulating layer 25 also has substantially the same shape and substantially the same structure as the insulating layer 20, has wide filling conductors 40 and 50 in both side portions 25a and 25b, and are electrically connected to the external electrode patterns 42 and 52 of the lower layers, respectively.

Since the inductor 1 has the above-described lamination structure, as shown in FIGS. 3 and 4, the coil body 3 is defined by the conductor patterns 31 to 34, and both magnetic poles of the coil body 3 are directed toward the same direction as the lamination direction. Furthermore, the external electrode 4 (5) is defined by the wide filling conductor 40 (50), the narrow filling conductor 41 (51), and the external electrode pattern 42 (52). Since the width of the narrow filling conductor 41 (51) is less than the widths of the wide filling conductor 40 (50) and the external electrode pattern 42 (52), recesses and projections 4a (5a) are provided on the inner side surface of the external electrode 4 (5), and the recesses and projections 4a (5a) are engaged with the internal insulator 2. Plating is performed on the surface of such an external electrode 4 (5).

Next, a description will be provided of a method of manufacturing the inductor 1 described above.

In FIG. 1, the lamination step S1 is a step of forming a laminate including a plurality of chips as shown in FIG. 3. By repeating the first process P1 and the second process P2, a desired laminate is formed.

The first process P1 is a process in which a photosensitive conductive paste is printed and applied to the insulating layers 20 to 25 shown in FIG. 2 and is exposed and developed by a photolithography process to thereby form conductor patterns 31 to 34 and external electrode patterns 42 and 52. The second process P2 is a process in which a photosensitive insulating paste having a thermal expansion coefficient substantially equal to that of the above-described photosensitive conductive paste is printed and applied to the conductor patterns 31 to 34 and the external electrode patterns 42 and 52 shown in FIG. 2 and is exposed and developed by a photolithography process to thereby form insulating layers 20 to 25 having a viahole and a cutout portion.

Such a lamination step S1 will be described below specifically with reference to the drawings.

FIGS. 5A to 5F include sectional views showing steps of forming an insulating layer of a lower layer in the second process of the lamination step. FIGS. 6A to 6F include sectional views showing steps in which a conductor pattern and an external electrode pattern are laminated on an insulating layer of a lower layer by performing the first process and the second process of the lamination step. FIGS. 7A to 7D include sectional views showing steps of forming an insulating layer of the topmost layer in the second process of the lamination step.

The actual lamination step is a step of forming a laminate including many chips. In these figures, in order to simplify understanding, one chip component is shown displayed.

Figure 5A:
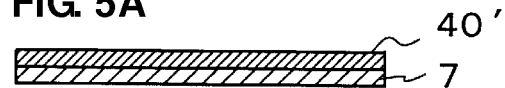
FIGS. 5A to 5F include sectional views showing steps of forming an insulating layer of a lower layer in a second process of a lamination step.
Figure 5B:
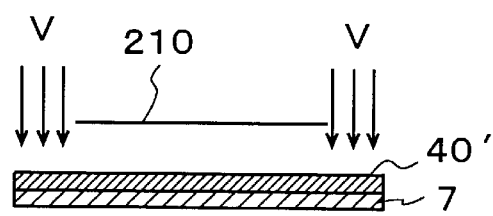
Figure 5C:
Figure 5D:
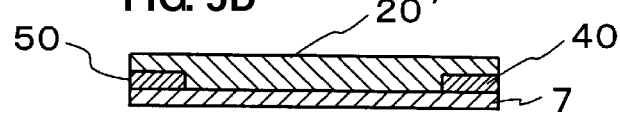
Figure 5E:
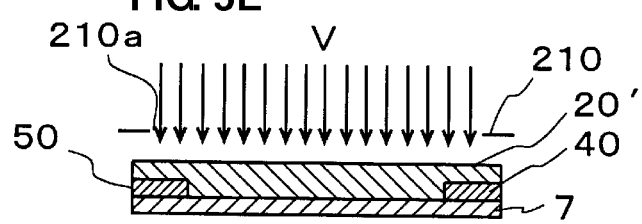
Figure 5F:
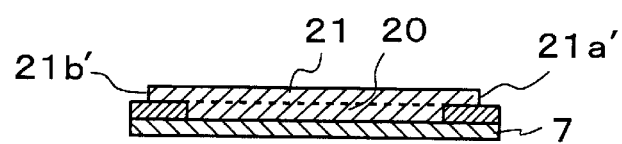

First, as shown in FIG. 5A, a photosensitive conductive paste 40', such as silver, for example, is printed and applied to a carrier film 7. Then, as shown in FIG. 5B, both sides of the photosensitive conductive paste 40' are exposed from a mask 210 using an ultraviolet ray V and developed to thereby obtain wide filling conductors 40 and 50 on both sides of the carrier film 7, as shown in FIG. 5C. As shown in FIG. 5D, a photosensitive insulating paste 20', such as glass, for example, is printed and applied to cover the wide filling conductors 40 and 50. Then, as shown in FIG. 5E, a photosensitive insulating paste 20' is exposed through the window 210a of the mask 210 and thereafter is developed to thereby form the insulating layer 20, and the insulating layer 21 includes cutout portions 21a' and 21b' on two opposed sides, as shown in FIG. 5F.

Then, the conductor patterns 31 to 34, the external electrode patterns 42 and 52, and the insulating layers 22 to 24 are laminated on the insulating layer 21.

More specifically, as shown in FIG. 6A, the photosensitive conductive paste 31' is filled in the cutout portions 21a' and 21b', is printed and applied to the insulating layer 21, and is exposed by being irradiated with an ultraviolet ray V via the mask 210. Then, the exposed photosensitive conductive paste 31' is developed. Thus, as shown in FIG. 6B, the narrow filling conductors 41 and 51 are formed in the cutout portions 21a' and 21b', and the conductor pattern 31 is formed on the insulating layer 21. Furthermore, the external electrode patterns 42 and 52 are formed on the narrow filling conductors 41 and 51, respectively. That is, the external electrode patterns 42 and 52 having substantially the same length as the side portions 21a and 21b of the insulating layer 21 are formed on the side portions 21a and 21b of the insulating layer 21, respectively. In a similar manner, the insulating layer 22, the narrow filling conductors 41 and 51, the conductor pattern 32, and the external electrode patterns 42 and 52 are laminated and formed. Thereafter, as shown in FIG. 6C, a photosensitive insulating paste 23' is printed and applied, is irradiated with an ultraviolet ray V via the mask 210, and is exposed and developed. Thus, the insulating layer 23 (see FIG. 2) having the cutout portions 23a' and 23b' and the viahole 23c is formed. Then, as shown in FIG. 6D, the photosensitive conductive paste 33' is filled in the cutout portions 23a' and 23b' and the viahole 23c, is printed and applied to the insulating layer 23, and is exposed by being irradiated with an ultraviolet ray V via the mask 210. Then, the exposed photosensitive conductive paste 33' is developed. Thus, as shown in FIG. 6E, the narrow filling conductors 41 and 51 are formed in the cutout portions 23a' and 23b', and the conductor pattern 33 is formed on the insulating layer 23 and is connected to the conductor pattern 32 via the viahole 23c. In a similar manner, after the insulating layer 24 is formed, as shown in FIG. 6F, the topmost conductor pattern 34 is laminated on the insulating layer 24.

In the manner described above, the coil body 3 is formed in the laminate using the conductor patterns 31 to 34.

Finally, the topmost insulating layer 25 is formed, and the lamination step S1 is completed.

Figure 7A:
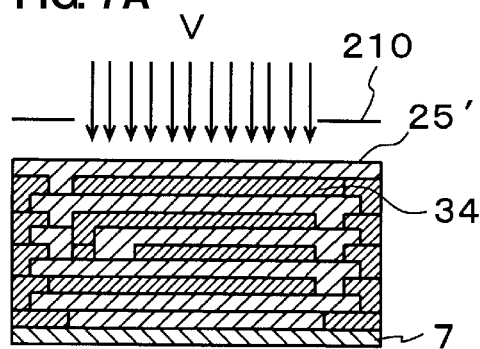
FIGS. 7A to 7D include sectional views showing steps of forming an insulating layer of the topmost layer in the second process of the lamination step.
Figure 7B:
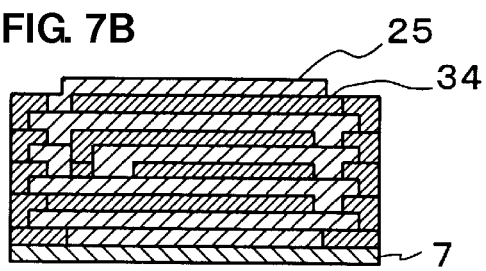
Figure 7C:
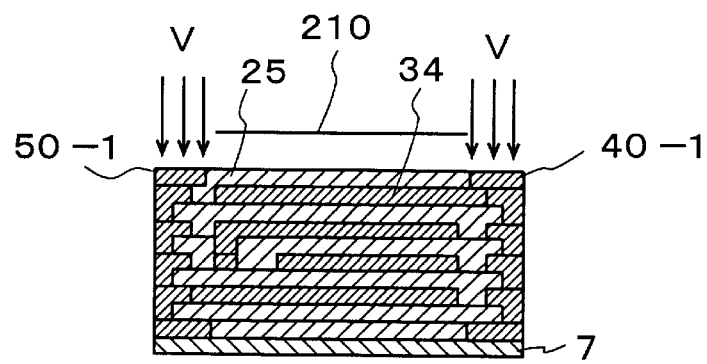

More specifically, as shown in FIG. 7A, a photosensitive insulating paste 25' is printed and applied to the conductor pattern 34 and the external electrode patterns 42 and 52, and is exposed and developed by being irradiated with an ultraviolet ray V via the mask 210. Thus, as shown in FIG. 7B, the insulating layer 25 having both sides thereof cut out in an amount corresponding to the width of the wide filling conductor 40 (50) is obtained. As shown in FIG. 7C, a photosensitive conductive paste 40-1 (50-1), such as silver, for example, is filled in the cutout on both sides of the insulating layer 25 and is exposed with the ultraviolet ray V to thereby obtain the wide filling conductor 40 (50).

Figure 7D:
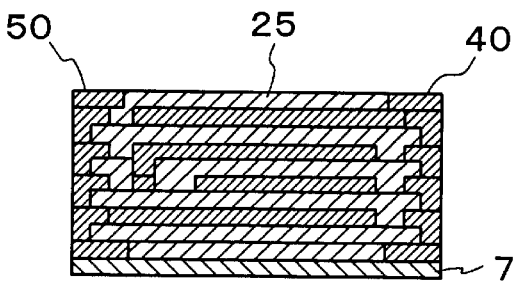
Figure 8:
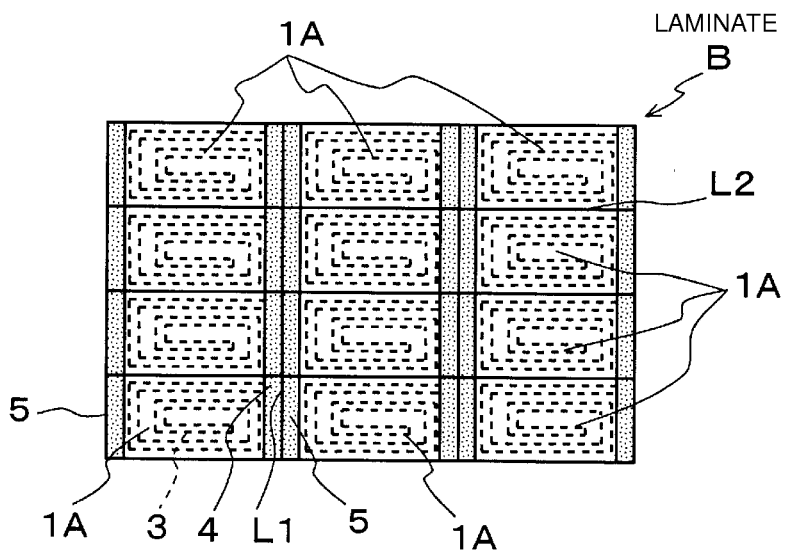
FIG. 8 is a plan view of a laminate.

As a result of performing the lamination step S1 in this manner, the laminate shown in FIG. 7D is formed. As shown in FIG. 8, an actual laminate B is a laminated sheet including a plurality of chips 1A.

After the lamination step S1 is performed, a division step S2 shown in FIG. 1 is performed.

The division step S2 is a step in which the laminate B formed in the lamination step S1 is divided into chips 1A.

Figure 9:
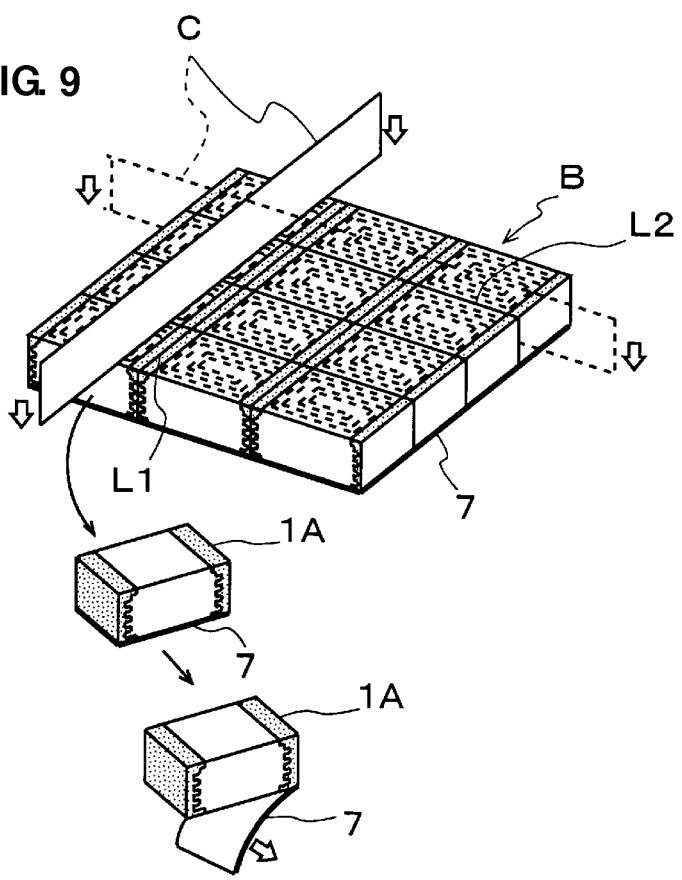
FIG. 9 is a schematic perspective view showing a division step.

FIG. 9 is a schematic perspective view showing the division step S2.

The division step S2 in this preferred embodiment is a step in which the laminate B is divided by a Guillotine cutting method. As shown in FIG. 9, the laminate B is divided into chips 1A using a cutter C. More specifically, the cutter C is aligned and cuts along a boundary line L1 of the external electrodes 4 and 5 of the adjacent chips 1A and also, the cutter C is aligned and cuts a boundary line L2 extending substantially perpendicular to the boundary line L1, as indicated by the dashed line, to divide the laminate into a plurality of chips 1A at the same time.

In the division step S2, since the cutter C cuts along the boundary line L1 of the external electrodes 4 and 5, a shearing force occurs within the plane along the motion of the cutter C.

Figure 10A:
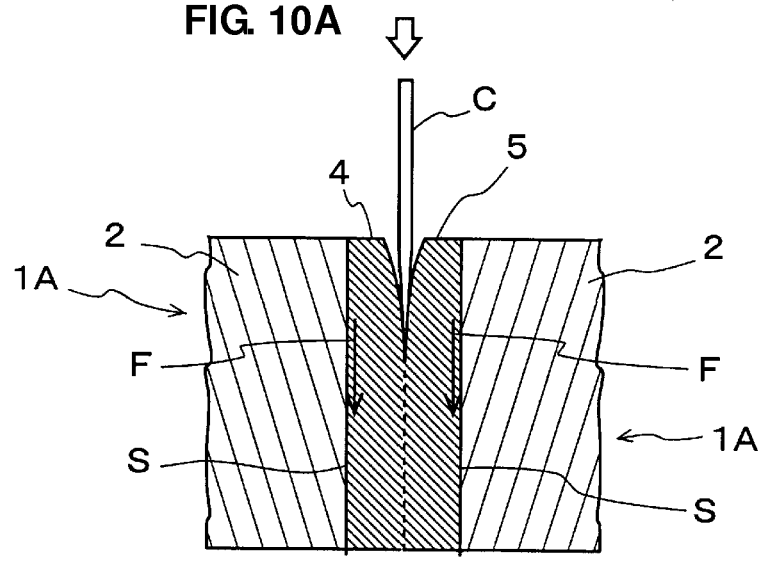
FIGS. 10A and 10B include schematic partial sectional views showing a state in which a shearing force using a cutter is applied.
Figure 10B:
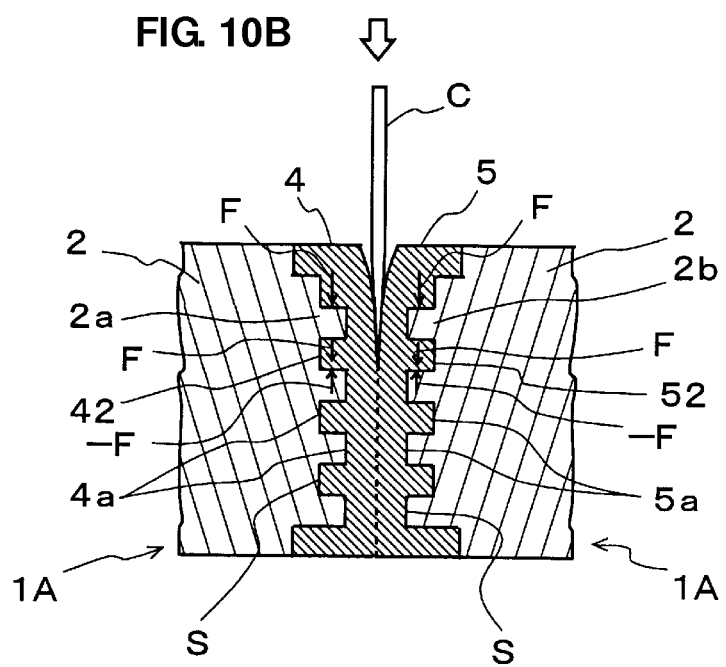

FIGS. 10A and 10B include schematic partial sectional views showing a shearing force imposed by the cutter C.

As shown in FIG. 10A, the motion of the cutter C causes a downward shearing force F to occur on a boundary surface S between the external electrode 4 (5) and the insulator 2. For this reason, when there are no recesses or projections on the boundary surface S, there is a risk that the shearing force F could causes the external electrode 4 (5) to be separated or deviated from the insulator 2.

However, in this preferred embodiment, as shown in FIG. 10B, recesses and projections are formed on the boundary surface S, that is, on the inner side of the external electrode 4 (5), and the external electrode 4 (5) is engaged with the insulator 2. Therefore, the shearing force F is imposed on the projection portions of the insulator 2. For example, the shearing force F that causes the external electrode pattern 42 (52) in FIG. 10B to be deviated downward is opposed by the upward shearing force −F that is generated by the engagement between the external electrode pattern 42 (52) and the insulator 2. Thus, the downward deviation of the external electrode pattern 42 (52) is prevented. As a result, the deviation of the external electrode 4 (5) as shown in FIG. 10A is prevented and chips 1A having outstanding characterstics are produced from the laminate B.

As shown in FIG. 9, since the carrier film 7 is attached on the bottom of each chip 1A divided from the laminate B, the carrier film 7 is peeled off and thereafter, the firing step S3 is performed.

The firing step S3 is a step in which each chip 1A in a half-dry state, which is formed in the division step S2, is fired in a furnace (not shown). After the firing step S3 is performed, a plating step S4 is performed.

The photosensitive conductive paste and the photosensitive insulating paste are preferably made of pastes having substantially equal thermal expansion coefficients. Therefore, during the firing step S3, stress inside the chip 1A, which occurs due to a difference in thermal expansions, is reduced.

As a consequence, it is possible to manufacture an inductor 1 having high dimensional accuracy.

The plating step S4 is a step in which Ni, Cu, Sn, or other suitable material, is plated on the surface of the external electrodes 4 and 5 of each chip 1A fired in the firing step S3. This completes the manufacture of the inductor 1.

As described above, according to the inductor manufacturing method of this preferred embodiment, the external electrodes 4 and 5 are also formed in the lamination step S1 at the same time as for the insulator 2 and the coil body 3. Therefore, a separate step to form the external electrodes 4 and 5 is not required, the manufacturing time is reduced accordingly. Furthermore, since the external electrodes 4 and 5 are also formed at the same time that the chip 1A is formed, the size of the chip 1A is substantially the same as a specified size. As a result, the size of the coil body 3 can be increased to obtain an inductor 1 having a sufficient inductance value.

For example, when an inductor of a specified size 0603 having a coil body of 12 layers, in which a conductor pattern includes one turn per layer, is to be manufactured using a photosensitive glass paste and a photosensitive silver paste, 13 steps of printing, exposing, and developing the photosensitive a glass paste in the lamination step, 13 steps of printing, exposing, and developing the photosensitive silver paste, one step of dividing a chip in the division step, one step of firing the chip in the firing step, one step of printing and firing the external electrode, one plating step in the plating step, and one step of examining a product are required. That is, in the manufacturing method of the related art, a total of 31 steps are required. In comparison, in the method of this preferred embodiment, since the operation of printing and firing external electrodes are not required, a total of only 30 operations are required. For this reason, when compared to the method of the related art, manufacturing time and cost are reduced.

Furthermore, when an inductor of a specified size 0603 is manufactured using the method of the related art, the size of the chip is limited to a length of about 0.56 mm, and vertical and horizontal sizes of about 0.26 mm, and the effective volume in which the coil body can be contained is about 0.0378 mm$^3$. For this reason, the maximum obtainable inductance value is limited to about 27 nH. In comparison, when an inductor of the specified size 0603 is manufactured using the method of this embodiment, the size of the chip is increased to a length of about 0.58 mm, and vertical and horizontal sizes of about 0.28 mm, and the effective volume in which the coil body can be contained is about 0.0439 mm$^3$, which is an increase of about 16%. For this reason, the maximum obtainable inductance value is increased to about 33 nH.

Furthermore, according to this preferred embodiment, since the external electrodes 4 and 5 are each formed integrally with the chip 1A, a large step difference does not exist between the external electrodes 4 and 5 and the surface of the inductor 1.

Figure 11A:
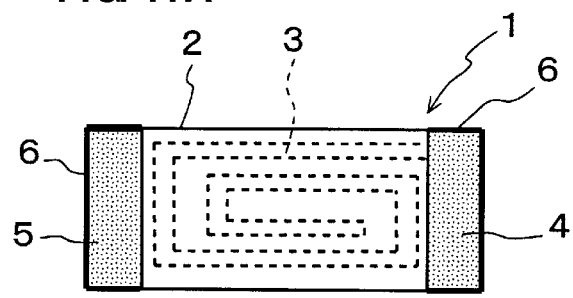
FIGS. 11A and 11B include exterior views illustrating a step difference in the inductor according to the first preferred embodiment.
Figure 11B:
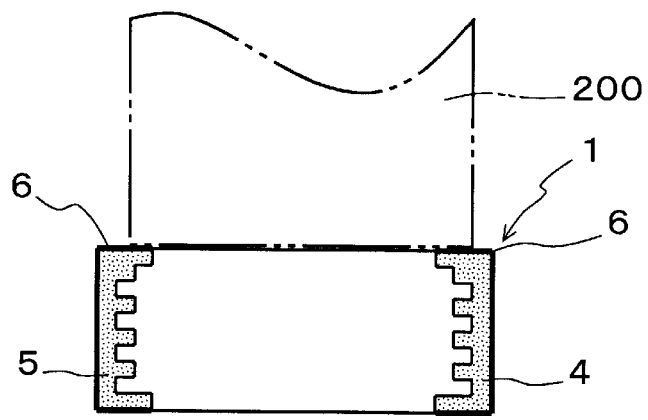

FIGS. 11A and 11B include exterior views illustrating a step difference in this preferred embodiment.

As shown in FIG. 11A, a step difference in the inductor 1 is caused by a very thin plated layer 6, and the amount of the step difference is negligible. For this reason, as shown in FIG. 11B, when a very small inductor 1 of a specified size is to be transported, a large gap does not exist between the suction nozzle 200 and the inductor 1. As a result, a problem caused by air leakage does not occur during transportation and during mounting using the suction nozzle 200. Furthermore, since the conductor patterns 31 to 34 and the external electrode pattern 42 (52) are formed using a photolithography process, it is possible to form the coil body 3 and the external electrodes 4 and 5 with high accuracy.

Second Preferred Embodiment

Next, a second preferred embodiment of the present invention will be described.

Figure 12:
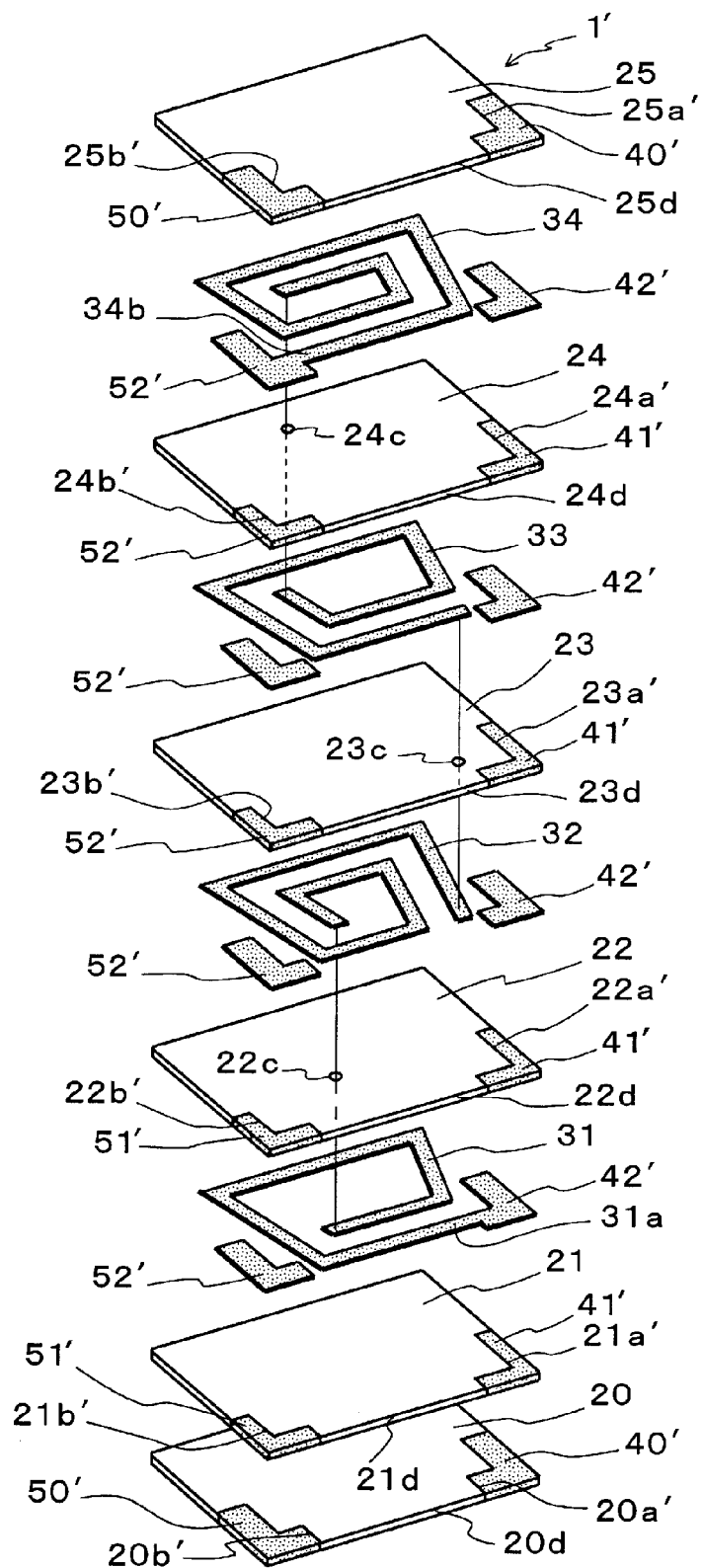
FIG. 12 is an exploded perspective view of an inductor manufactured by a method according to a second preferred embodiment of the present invention.
Figure 13:
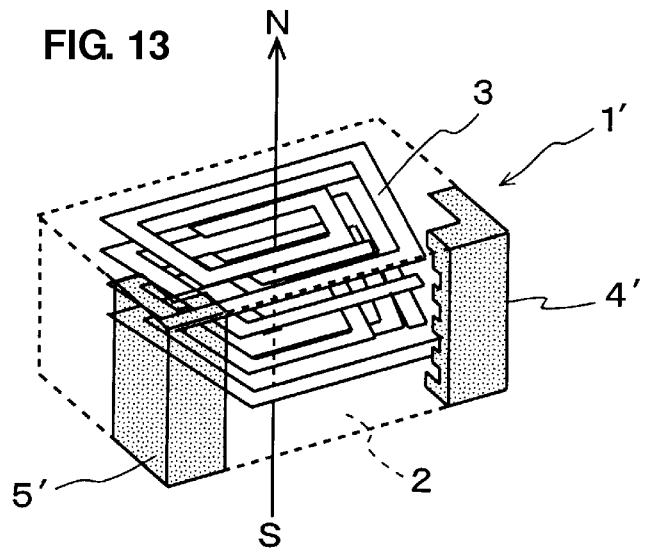
FIG. 13 is a perspective view of an inductor in a state in which a coil body is shown transparently.

FIG. 12 is an exploded perspective view of an inductor manufactured using a method according to the second preferred embodiment of the present invention. FIG. 13 is a perspective view of an inductor in a state in which a coil body is shown transparently.

This preferred embodiment is a method of manufacturing an inductor 1' having external electrodes 4' and 5', which are L-shaped when viewed from the lamination direction, as shown in FIG. 13.

That is, in the second process P2 of the lamination step S1, as shown in FIG. 12, L-shaped cutout portions 20a' and 20b' are formed in both corner portions (corner portions on both right and left sides in the figure) of one side portion 20d of the insulating layer 20, and wide filling conductors 40' and 50' are formed in these cutout portions 20a' and 20b', respectively. Furthermore, on the topmost insulating layer 25, similarly, L-shaped cutout portions 25a' and 25b' are formed in both corner portions of a side portion 25d, and wide filling conductors 40' and 50' are formed therein, respectively.

Then, the first process P1 and the second process P2 of the lamination step S1 are repeated, so that L-shaped cutout portions 21a' (22a' to 24a') and 21b' (22b' to 24b') are formed in both corner portions of the side portions 21d to 24d of the insulating layers 21 to 24 corresponding to the side portion 20d (25d) of the insulating layer 20 (25), and narrow filling conductors 41' and 51' are formed in these cutout portions 21a' (22a' to 24a') and 21b' (22b' to 24b').

Furthermore, in the conductor patterns 31 to 34, at locations corresponding to the narrow filling conductors 41' and 51' of the insulating layers 21 to 24, external electrode patterns 42' and 52' having substantially the same shape as the narrow filling conductors 41' and 51' are formed, the outer end portion 31a of the conductor pattern 31 is substantially continuous with the external electrode pattern 42', and the outer end portion 34b of the conductor pattern 34 is substantially continuous with the external electrode pattern 52'.

Figure 14A:
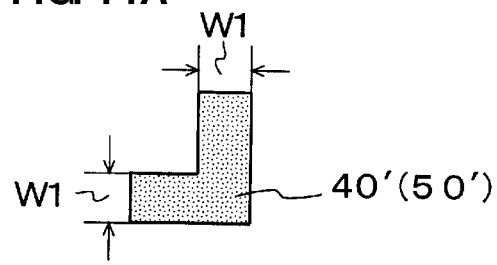
FIGS. 14A to 14C include plan views showing the relationship among a wide filling conductor, a narrow filling conductor, and an external electrode pattern.
Figure 14B:
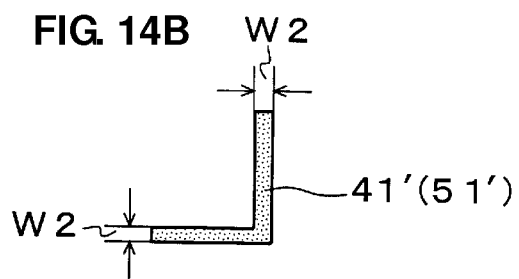
Figure 14C:
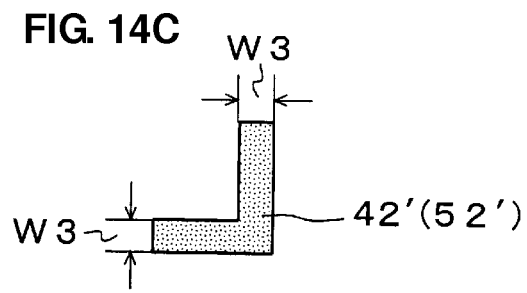

FIGS. 14A to 14C include plan views showing the relationship between the wide filling conductor 40' (50'), the narrow filling conductor 41' (51'), and the external electrode pattern 42' (52').

All of the wide filling conductor 40' (50'), the narrow filling conductor 41' (51'), and the external electrode pattern 42' (52') form an L shape and have substantially the same shape.

However, as shown in FIGS. 14A to 14C, the width W1 of the wide filling conductor 40' (50') is the widest, the width W2 of the narrow filling conductor 41' (51') is narrowest, and the width W3 of the external electrode pattern 42' (52') is between the width W1 and the Width W3. For this reason, as shown in FIG. 13, the external electrode 4' (5') formed such that these conductors 40' to 42' (50' to 52') are laminated includes recesses and projections on its inner surface.

Figure 15:
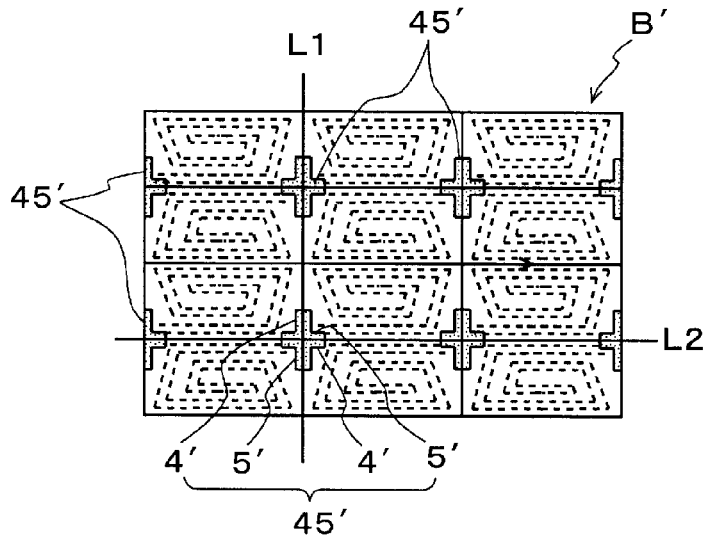
FIG. 15 is a plan view of a laminate formed in a lamination step of the second preferred embodiment of the present invention.
Figure 16:
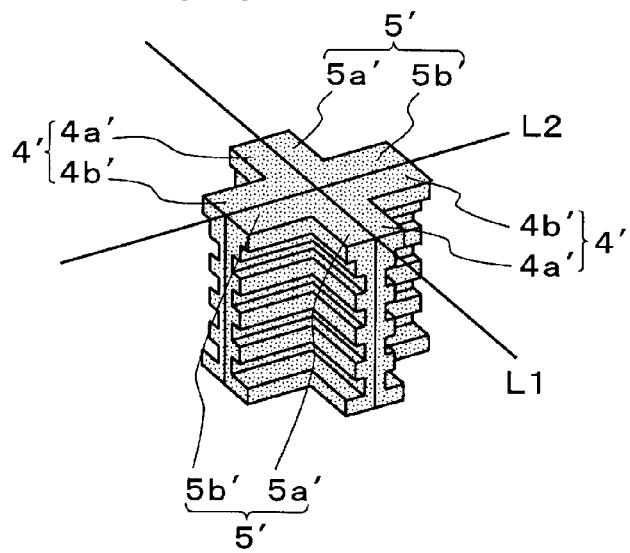
FIG. 16 is a perspective view showing a coupling unit for external electrodes, which is formed inside the laminate.

FIG. 15 is a plan view of a laminate B' formed in the lamination step S1 of the second preferred embodiment. FIG. 16 is a perspective view showing a coupling unit 45' for the external electrodes 4' and 5' formed inside the laminate B'.

As shown in FIG. 15, the laminate B' formed in the lamination step S1 of this preferred embodiment includes the coupling unit 45' for the external electrodes 4' and 5'. In the division step S2, the laminate B' is cut along the boundary line L1 and the boundary line L2 passing through the coupling unit 45'. As shown in FIG. 16, not only the recesses and projections of the side portions 4a' and 5a' of the external electrodes 4' and 5', but also the recesses and projections of the side portions 4b' and 5b' oppose a shearing force that occurs when the laminate is cut along the boundary line L1. Furthermore, the recesses and projections of the side portions 4b' and 5b' of the external electrodes 4' and 5' oppose a shearing force that occurs when the laminate is cut along the boundary line L2 and also, the recesses and projections of the side portions 4a' and 5a' oppose the shearing force. That is, since each shearing force is opposed from two directions, the external electrodes 4' and 5' are not deviated from the insulator 2.

In the inductor 1 of the first preferred embodiment, as shown in FIG. 10B, the external electrodes 4 and 5 are designed not to be deviated. Deviation is prevented for only an external force applied to the boundary line L1 of the external electrodes 4 and 5, and deviation prevention is not provided for an external force applied to the boundary line L2 at right angles to the boundary line L1. However, in this preferred embodiment, as described above, each of the external forces in the two directions of the boundary lines L1 and L2 is opposed from two directions, such that the deviations of the external electrodes 4' and 5' is prevented. The yield in which the deviation of the external electrode is measured in the division step is about 90% for the inductor 1 of the first preferred embodiment and about 95% for the inductor 1' of this preferred embodiment.

The divided chips undergo the firing step S3 and proceed to a plating step S4. In plating step S4, plating is performed on the surfaces of the external electrodes 4' and 5', and the manufacturing of the inductor 1' is completed.

As described above, according to the method of manufacturing the inductor 1' of this preferred embodiment, since the external electrodes 4' and 5' are formed in an L shape and the occupied volume of the external electrodes are decreased, it is possible to further increase the size of the coil body 3 and to obtain a sufficient inductance value.

For example, when an inductor of the specified size 0603 is manufactured using the method of the first preferred embodiment, the size of the chip has a length of about 0.58 mm, and vertical and horizontal sizes of about 0.28 mm, and the effective volume capable of containing the coil body is about 0.0439 $mm^3$. As a result, the maximum obtainable inductance value is about 33 nH. In comparison, when an inductor of the specified size 0603 is manufactured by the method of this preferred embodiment, the size of the chip is increased to a length of about 0.59 mm, and vertical and horizontal sizes of about 0.29 mm, and the effective volume capable of containing the coil body is about 0.0496 $mm^3$, which is an increase of about 13%. For this reason, the maximum obtainable inductance value is increased to about 36 nH.

Figure 17:
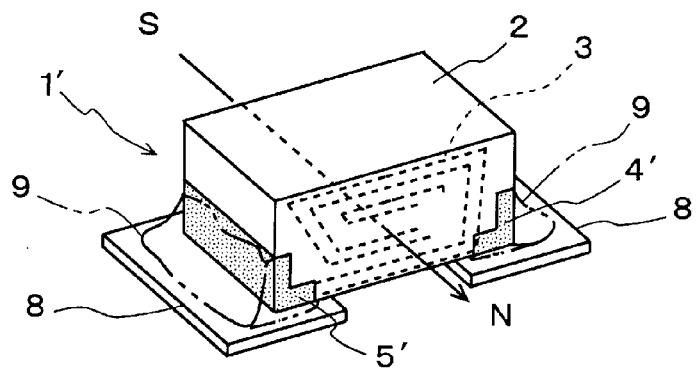
FIG. 17 is a perspective view showing a state in which an inductor is mounted.

FIG. 17 is a perspective view showing a state in which the inductor 1' is mounted.

In the inductor 1 manufactured by the method of the first preferred embodiment, as shown in FIG. 3, the coil body 3 is mounted with both N and S poles thereof facing up and down. However, when it is mounted in this manner, since the environment on the N pole side differs from the environment on the S pole side, magnetic coupling differs each time the directions of the input side and the output side of the inductor 1 are changed. Therefore, the inductor 1 of the first preferred embodiment has directivity.

However, in the inductor 1' manufactured by the method of this preferred embodiment, as shown in FIG. 17, the inductor 1' is soldered to lands 8 and 8. Thus, both the N pole side and the S pole side are in an air environment. For this reason, even if the directions of the input side and the output side of the inductor 1' are changed, magnetic coupling is not changed, and the inductor 1' does not have directivity.

Furthermore, in the inductor 1 manufactured by the method of the first preferred embodiment, as shown in FIG. 3, the exteriors of the upper-lower surface and the side surface are different in order to identify fall from two different directions. In comparison, in the inductor 1' of this preferred embodiment, as shown in FIG. 13, the exteriors of the upper surface, the lower surface, and the side surface are different in order to identify fall from three different directions. As a consequence, the ability to recognize fall of the inductor 1' is increased further.

Furthermore, in this preferred embodiment, since the external electrodes 4' and 5' have an L shape, as indicated by an alternate long and two short dashes line, it is possible to sufficiently adhere fillets 9 and 9 to the standing surfaces of the external electrodes 4' and 5' correspondingly. By lengthening or shortening the external electrodes 4' and 5' at the time of manufacture, it is possible to obtain a desired amount of adhered fillet.

Since the remaining elements and advantages of this preferred embodiment are the same as those of the first preferred embodiment, descriptions thereof are omitted.

Third Preferred Embodiment

Next, a third preferred embodiment of the present invention will be described.

Figure 18:
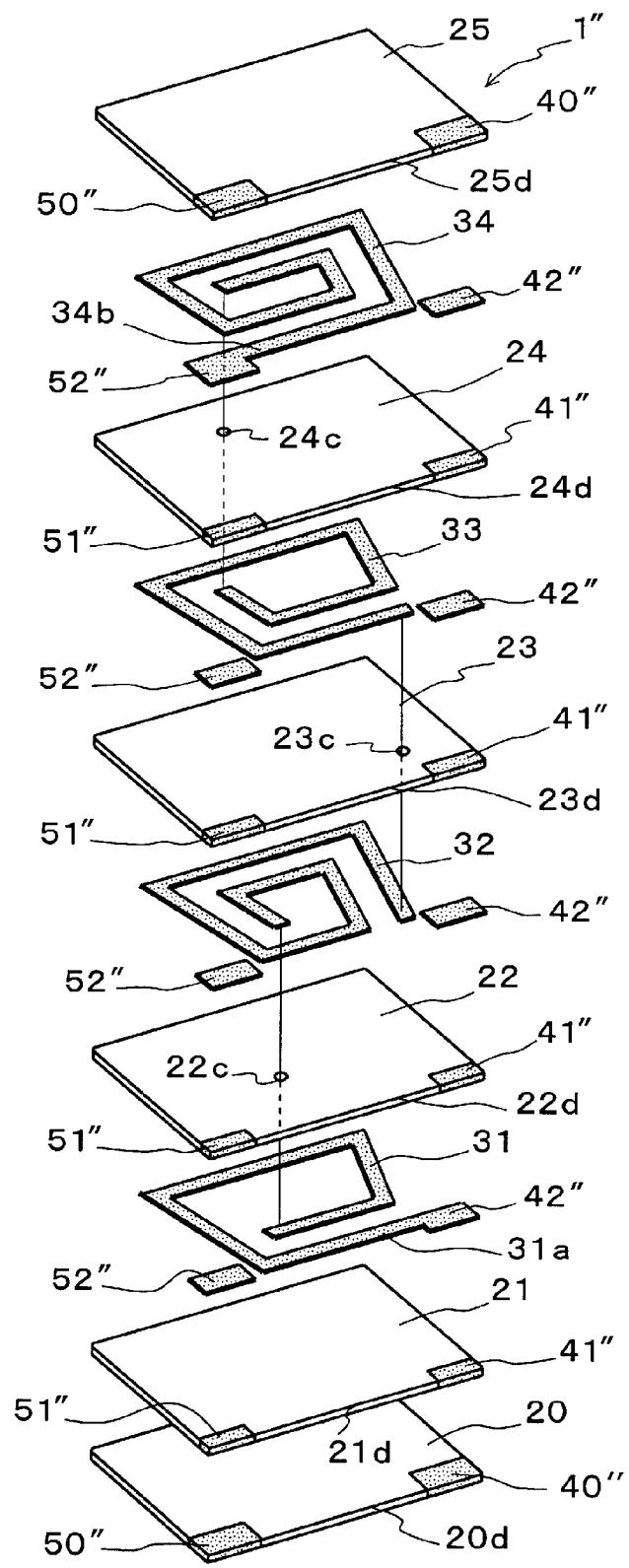
FIG. 18 is an exploded perspective view of an inductor manufactured by a method according to a third preferred embodiment of the present invention.
Figure 19:
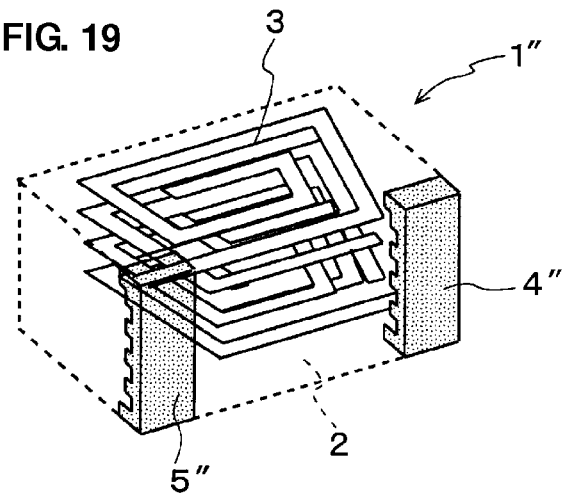
FIG. 19 is a perspective view of an inductor in a state in which a coil body is shown transparently.
Figure 20:
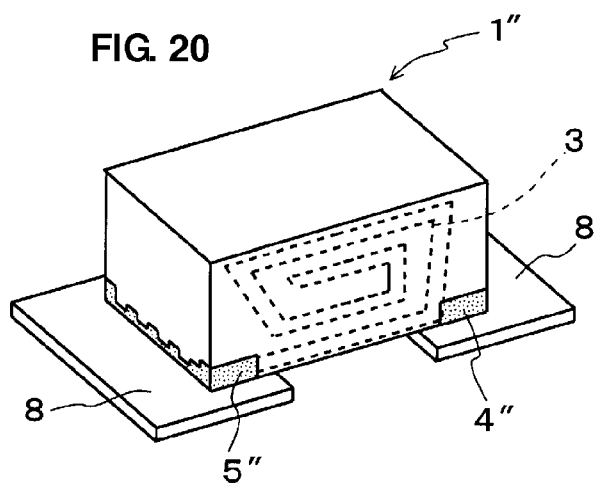
FIG. 20 is a perspective view showing a state in which an inductor is mounted.
Figure 21:
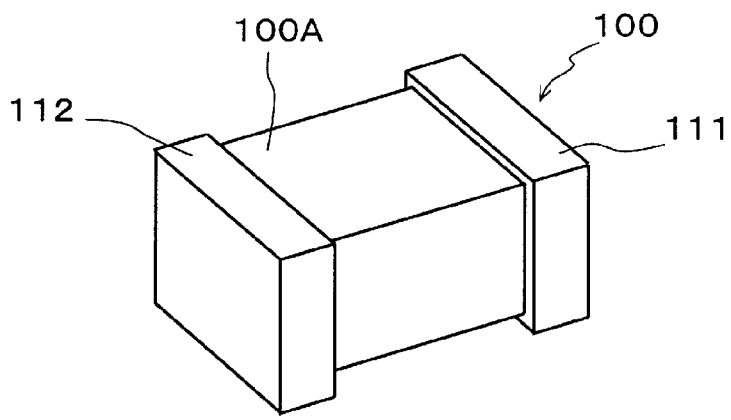
FIG. 21 is an exterior view of an inductor of the related art.

FIG. 18 is an exploded perspective view of an inductor manufactured by the method of the third preferred embodiment of the present invention. FIG. 19 is a perspective view of an inductor in a state in which a coil body is shown transparently. FIG. 20 is a perspective view showing a state in which an inductor is mounted.

This preferred embodiment, as shown in FIG. 19, is a method of manufacturing an inductor 1" having external electrodes 4" and 5" formed in a long shape when viewed from the lamination direction in two corner portions.

That is, as shown in FIG. 18, wide filling conductors 40" and 50" having an elongated shape, which are shorter than half the length of the side portion 20*d* (25*d*), are formed in two corner portions of one side portion 20*d* (25) of the insulating layer 20, and narrow filling conductors 41" and 51" having substantially the same length are formed in the two corner portions of the side portions 21*d* to 24*d* of the insulating layers 21 to 24 correspondingly. Then, in the conductor patterns 31 to 34, external electrode patterns 42" and 52" having substantially the same length as the narrow filling conductors 41" and 51" are formed accordingly. The outer end portion 31*a* of the conductor pattern 31 is continuous with the external electrode pattern 42", and the outer end portion 34*b* of the conductor pattern 34 is continuous with the external electrode pattern 52". Also, in this preferred embodiment, the width of the wide filling conductor 40" (50") is widest, the width of the narrow filling conductor 41" (51") is narrowest, and the width of the external electrode pattern 42" (52") is between the width of the wide filling conductor 40" (50") and the narrow filling conductor 41" (51").

In the manner described above, as shown in FIG. 19, recesses and projections are formed on the inner side surface of the external electrode 4" (5").

As described above, according to the method of manufacturing an inductor 1" of this preferred embodiment, the external electrodes 4" and 5" are shorter than the external electrodes 4' and 5' in an L shape of the second preferred embodiment, and the occupied volume of the external electrodes are further decreased. As a consequence, it is possible to obtain a coil body 3 having a large inductance value.

Furthermore, as shown in FIG. 20, in the inductor 1" manufactured by the method of this preferred embodiment, the inductor 1" is soldered to the lands 8 and 8. Thus, it is possible to arrange both the N pole side and the S pole side in an air environment.

Since the other elements and advantages are the same as those in the second preferred embodiment, descriptions thereof are omitted.

The present invention is not limited to the above-described preferred embodiments, and various modifications and changes are possible within the spirit and scope of the present invention.

For example, in the above-described preferred embodiments, a method of manufacturing an inductor having recesses and projections on the inner side surface of the external electrodes 4 and 5 (4' and 5', 4" and 5") has been described. However, a method of manufacturing an inductor having external electrodes whose inner side surface is flat is not excluded from the range of the present invention.

While preferred embodiments of the present invention have been described above, it is to be understood that variations and modifications will be apparent to those skilled in the art without departing the scope and spirit of the present invention. The scope of the present invention, therefore, is to be determined solely by the following claims

What is claimed is:

1. A method of manufacturing an inductor, the method comprising:
 a lamination step of forming a laminate having a plurality of chips each including a coil body enclosed in an insulating layer and a pair of external electrodes that are connected to opposed ends of the coil body, the external electrodes being exposed from the insulating layer;
 a division step of dividing the laminate formed in the lamination step at a portion of each of the pair of external electrodes into chips; and
 a firing step of firing each chip formed in the division step; wherein
 the lamination step includes:
  a first process of forming, using a conductive paste, a conductor pattern for the coil body on the insulating layer and an external electrode pattern for the external electrodes in a side portion of the insulating layer by one of a printing process and a photolithography process; and
  a second process of forming, using an insulating paste, the insulating layer having a viahole enabling the conductor pattern to be inspected therethrough and a cutout portion that is continuous with the external electrode pattern on the conductor pattern and the external electrode pattern by one of a printing process and a photolithography process; and
 repeating the first and second processes to form the plurality of chips each including the coil body formed of the conductor pattern and the viahole, and a pair of external electrodes formed of the external electrode pattern and a conductor filled in the cutout portion, wherein
 in the first process of the lamination step, the external electrode pattern has an elongated shape, which is shorter than half a length of the side portion, and is formed in each of two corner portions of one side portion of the insulating layer, and in the second process of the lamination step, the cutout portion has an elongated shape having substantially the same length as the external electrode pattern and is formed in each of the two corner portions of the one side portion.

2. The method of manufacturing an inductor according to claim 1, wherein, in the second process of the lamination step, the cutout port has a width that is less than the width of the external electrode pattern.

3. The method of manufacturing an inductor according to claim 1, wherein in the first process of the lamination step, a photosensitive conductive paste is applied to the insulating layer and is exposed and developed by the photolithography process to thereby form the conductor pattern and the external electrode pattern, and in the second process of the lamination step, a photosensitive insulating paste is applied to the conductor pattern and the external electrode pattern and is exposed and developed by the photolithography process to thereby form the insulating layer having the viahole and the cutout portion.

4. The method of manufacturing an inductor according to claim 1, wherein, in the lamination step, the directions of both magnetic poles of the coil body are substantially the same direction as a lamination direction.

5. The method of manufacturing an inductor according to claim 1, wherein the conductive paste and the insulating paste have substantially equal thermal expansion coefficients.

6. The method of manufacturing an inductor according to claim 1, further comprising a plating step of plating the surface of the external electrode of each chip fired in the firing step.

\* \* \* \* \*